US008738976B2

(12) United States Patent  (10) Patent No.: US 8,738,976 B2
Nakano et al. (45) Date of Patent: May 27, 2014

(54) MEMORY ERROR DETECTING APPARATUS AND METHOD

(75) Inventors: Rikizo Nakano, Kawasaki (JP); Osamu Ishibashi, Kawasaki (JP); Sadao Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 13/163,606

(22) Filed: Jun. 17, 2011

(65) Prior Publication Data

US 2011/0314347 A1  Dec. 22, 2011

(30) Foreign Application Priority Data

Jun. 21, 2010 (JP) ................................. 2010-140048

(51) Int. Cl.
*G11C 29/00* (2006.01)

(52) U.S. Cl.
USPC .......................................... 714/719; 714/763

(58) Field of Classification Search
USPC .................. 714/719, 718, 763, 630, 754, 819
See application file for complete search history.

(56) References Cited

U.S. PATENT DOCUMENTS

| 5,271,015 | A  | * | 12/1993 | Akiyama ....................... 714/722 |
| 6,058,047 | A  | * | 5/2000  | Kikuchi .................... 365/185.33 |
| 6,789,224 | B2 |   | 9/2004  | Miura |
| 7,246,257 | B2 | * | 7/2007  | Lai et al. ....................... 714/6.2 |
| 7,444,540 | B2 | * | 10/2008 | Shaw ............................. 714/6.1 |
| 7,602,642 | B2 | * | 10/2009 | Choi ........................ 365/185.09 |
| 8,362,766 | B2 | * | 1/2013  | Jungleib et al. ............... 324/300 |
| 2004/0117580 | A1 | * | 6/2004 | Wu et al. ....................... 711/170 |
| 2004/0193948 | A1 | * | 9/2004 | Ono ................................. 714/6 |
| 2004/0237001 | A1 | * | 11/2004 | Schulz et al. ................... 714/42 |
| 2006/0218486 | A1 | * | 9/2006 | Zhao ............................ 715/513 |
| 2006/0288177 | A1 | * | 12/2006 | Shaw ............................ 711/162 |
| 2007/0255999 | A1 | * | 11/2007 | Risse ............................ 714/766 |
| 2009/0327800 | A1 | * | 12/2009 | Kim ................................. 714/5 |
| 2011/0202813 | A1 | * | 8/2011 | Resnick ........................ 714/748 |

FOREIGN PATENT DOCUMENTS

| JP | 5-88989      | 4/1993 |
| JP | 11-025006    | 1/1999 |
| JP | 11-102328 A  | 4/1999 |
| JP | 2001-209589  | 8/2001 |

(Continued)

OTHER PUBLICATIONS

"Korean Patent Office Action" mailed by KPO and corresponding to Korean Application No. 10-2011-59601 on Jan. 21, 2013, with English translation.

(Continued)

*Primary Examiner* — Albert Decady
*Assistant Examiner* — Osman Alshack
(74) *Attorney, Agent, or Firm* — Fujitsu Patent Center (57) ABSTRACT

A memory error detecting apparatus for detecting an error of a subject memory, the memory error detecting apparatus includes a memory bus connected to the subject memory, a mirror memory connected to the memory bus so as to receive the same data as data to be written into and read from the subject memory, the received data being written into the mirror memory, an address acquiring portion configured to acquire an address related to the data written into the subject memory, a mirror memory controller configured to control data writing or reading to or from the mirror memory on the basis of the acquired address, a comparator configured to compare data read from the subject memory and data read from the mirror memory, and an error detector configured to detect a data error on the basis of a result of the comparison.

6 Claims, 9 Drawing Sheets

(56) References Cited

FOREIGN PATENT DOCUMENTS

| JP | 2007-136862 | 6/2007 |
| KR | 2000-0002074 U | 1/2000 |
| KR | 2000-0015658 U | 8/2000 |
| KR | 2001-0076307 | 8/2001 |

OTHER PUBLICATIONS

Japanese Office Action mailed Dec. 17, 2013 for corresponding Japanese Application No. 2010-140048, with partial English-language translation.

* cited by examiner

--RELATED ART--

| Function | CKE | | CS# | RAS# | CAS# | WE# | A10 |
|---|---|---|---|---|---|---|---|
| | Prev. Cycle | Next Cycle | | | | | |
| MODE REGISTER SET | H | H | L | L | L | L | V |
| REFRESH | H | H | L | L | L | H | V |
| Single-bank PRECHARGE | H | H | L | L | H | L | L |
| PRECHARGE all banks | H | H | L | L | H | L | H |
| bank ACTIVATE | H | H | L | L | H | H | V |
| WRITE | H | H | L | H | L | L | L |
| WRITE with auto precharge | H | H | L | H | L | L | H |
| READ | H | H | L | H | L | H | L |
| READ with auto precharge | H | H | L | H | L | H | H |
| NO OPERATION | H | H | L | H | H | H | V |

V:H or L

MEMORY ERROR DETECTING APPARATUS AND METHOD

CROSS-REFERENCE TO RELATED APPLICATION

This application is based upon and claims the benefit of priority of the prior Japanese Patent Application No. 2010-140048, filed on Jun. 21, 2010, the entire contents of which are incorporated herein by reference.

FIELD

The embodiments discussed herein are related to a memory error detecting apparatus, a logic analyzer and a memory error detecting method.

BACKGROUND

Figure 1:
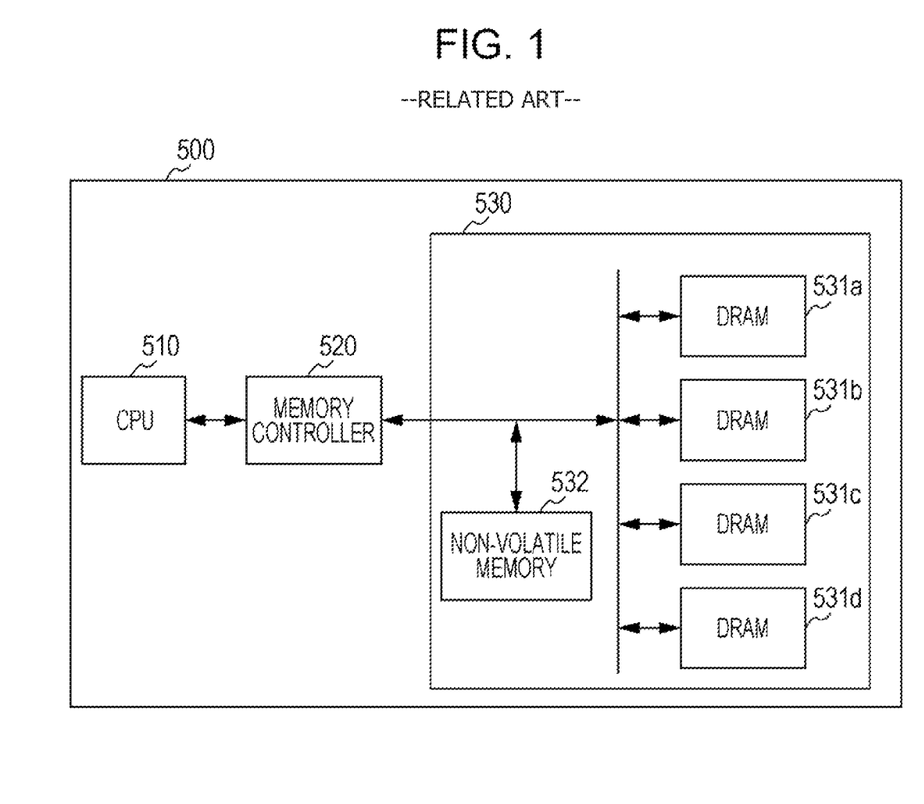
FIG. 1 is a block diagram illustrating an example of the configuration of an information processing apparatus in a prior art.

Conventionally, an information processing apparatus such as a personal computer may have had a memory module such as a DIMM (Dual Inline Memory Module) which is a main memory. For example, as illustrated in FIG. 1, an information processing apparatus 500 includes a CPU (Central Processing Unit) 510, a memory controller 520, and a DIMM 530.

The CPU 510 is an arithmetic processing apparatus which performs data computing and processing and instructs the memory controller 520 to write/read data to/from the DIMM 530. The memory controller 520 is connected to the DIMM 530 and, in accordance with an instruction from the CPU 510, writes or reads data to or from the DIMM 530. The DIMM 530 has a plurality of DRAMs (dynamic random access memories) 531$a$ to 531$d$, and the DRAMs 531$a$ to 531$d$ store data.

The memories are physically linearly disposed in accordance with the address spaces in the CPU. In recent years, a CPU has used virtual memory which virtually allocates a memory space protected for each process. Thus, a memory management function such as paging has been used which manages the space of a main storage device by dividing the space into pages having a predetermined size. Another method may be memory segmentation. Such a memory management function may be built in a CPU for a personal computer.

The virtual memory refers to a type of memory management method which allows a multitask operating system having discontinuous memory areas to pretend to have continuous memory areas against software (such as processes). The virtual memory provides a system for virtually implementing a larger storage area than a main storage device provided on a computer. The system of the virtual memory allows the use of a part of the memory space for a large-capacity external storage device such as a hard disk device and may provide the use of a memory space more than the capacity of the memory.

A virtually given address is called a logical address, and a valid address on real memory is called a physical address. The range of logical addresses is called a logical address space, and the range of physical addresses is called a physical address space.

A memory address is a unique identifier of a position on memory to or from which a CPU or other hardware writes and reads data in a computer. Typically, the memory address is expressed by an integer. In a computer in a byte access mode, an address is used for identifying one byte in memory. For that, data which does not fit to one byte is stored in a plurality of bytes occupying continuous addresses. A memory address is used in both logical memory and physical memory.

If a memory error occurs in the DIMM 530 when the information processing apparatus is being used, the information processing apparatus is stopped once, and the failed DIMM 530 may be replaced, imposing a load on a user. A memory error may be caused by a failed block (failure area) which is disabled to store data among memory blocks (storage areas) in the DRAMs 531$a$ to 531$d$.

The failure information on the DRAMs 531$a$ to 531$d$ may be stored collectively in a non-volatile memory 532 provided in the DIMM 530, for example, as illustrated in FIG. 1. The failure information on the DRAMs 531$a$ to 531$d$ may be separately stored in non-volatile memory areas provided within the DRAMs 531$a$ to 531$d$.

Figure 2:
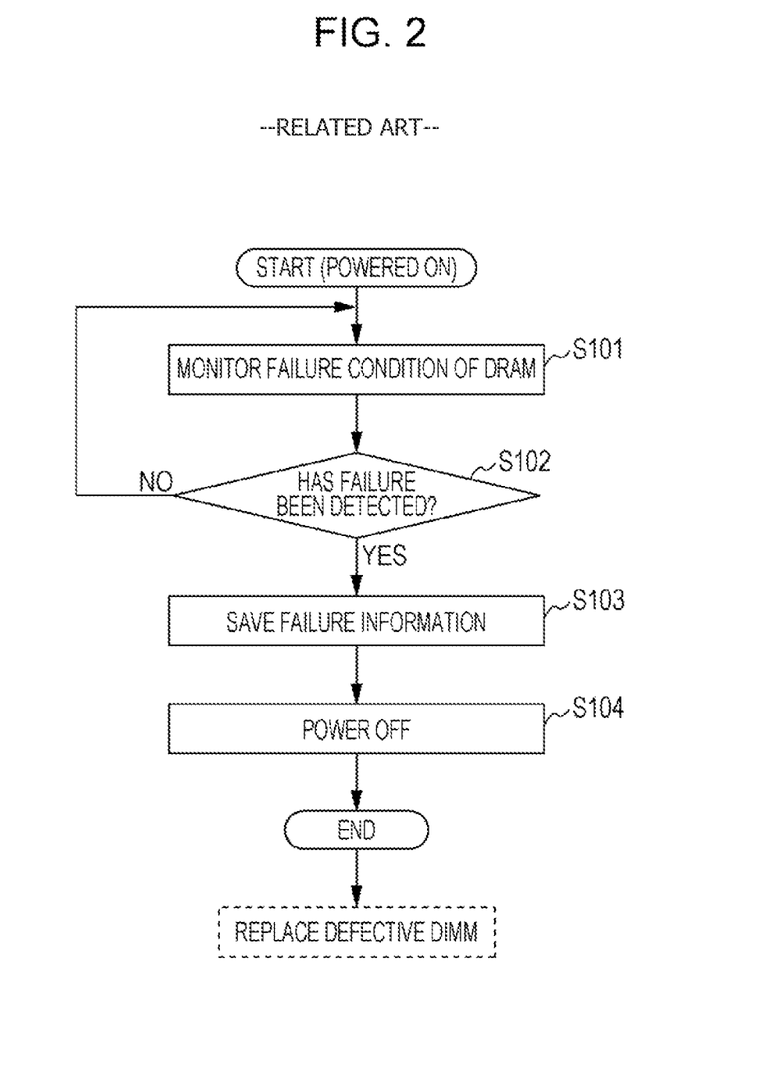
FIG. 2 is a flowchart illustrating an example of a processing routine when an memory error occurs in a prior art.

FIG. 2 illustrates an example of a processing routine when a memory error occurs. As illustrated in FIG. 2, upon powered on, a chip set starts monitoring a failure condition of the DRAMs 531$a$ to 531$d$ (S101). Next, the chip set determines whether a failure of the DRAMs 531$a$ to 531$d$ has been detected or not (S102). If no failure is detected in the DRAMs 531$a$ to 531$d$ (No in S102), the processing moves to S101 where the chip set continuously monitors a failure condition of the DRAMs 531$a$ to 531$d$. On the other hand, if it is determined that a failure in the DRAMs 531$a$ to 531$d$ has been detected (Yes in S102), the chip set saves the failure information (S103) and then powers off (S104). The processing then ends. If the DIMM 530 determined as having a failure is replaced by a new DIMM 530.

The memory error refers to a state that a failed block which is disabled to store data, that is, a failure region occurs in a memory block of a DRAM or a storage area. If a memory has an error, the module having the memory with the error is removed from the computer system, and the memory is replaced. Then, the memory module is inserted to the computer system again.

In a memory module having an error, the failure position in the memory may be analyzed and identified.

For the memory failure analysis, detecting an error address and error bit in the memory of a memory module is important. However, an error address and an error bit displayed by a CPU refer to a logical address and bit, the logical address may be converted to a physical address for identification of the memory having the error.

A memory controller accesses the position instructed in memory in accordance with an instruction from the CPU. When the conversion specifications for converting the logical address instructed by the CPU to a physical address in a memory controller is not available to a user, it is difficult to correlate the memory error and the error in the system having the memory module.

According to a memory error analysis method in a prior art, each of the memory modules may have been inserted to a testing system to determine the memory having an error within a memory module. Furthermore, because the conversion specifications to a physical address are not available, the error analysis has taken time.

When the analysis is performed by a testing system which is different from the system having used the memory module, a difference may occur in the system environment. The difference may result in a different error determination. For that reason, the error may not be found by the test in some error modes.

Detail examples of memory test coverage failures will be described. Following intermittent and marginal failures may cause a system operational failure though the memories having the failures operate normally when they are normally tested alone: 1) A failure caused when a subject memory is operated under a specific algorithm. 2) A failure caused only when the subject memory is dependent on specific write data. 3) A failure under influence a controller or a power supply system, which is caused only when the subject memory is used in applications for the controller or power supply system. 4) A failure under influence a load condition or a transmission system, which is caused only when the subject memory is used in applications for the load condition or transmission system. 5) A failure caused only when the subject memory is used at a specific timing (asynchronously). 6) A failure caused by significant operation variations of memory cells due to repetitive accesses to the subject memory. These failures may be analyzed only when the subject memory is used in an actual system.

The following is a reference document.

[Patent Document 1] Japanese Laid-open Patent Publication No. 11-102328

SUMMARY

According to an aspect of the embodiment, a memory error detecting apparatus for detecting an error of a subject memory, the memory error detecting apparatus includes a memory bus connected to the subject memory, a mirror memory connected to the memory bus so as to receive the same data as data to be written into and read from the subject memory, the received data being written into the mirror memory, an address acquiring portion configured to acquire an address related to the data written into the subject memory, a mirror memory controller configured to control data writing or reading to or from the mirror memory on the basis of the acquired address, a comparator configured to compare data read from the subject memory and data read from the mirror memory, and an error detector configured to detect a data error on the basis of a result of the comparison.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present techniques will be explained with reference to accompanying drawings.

According to an embodiment, a storage device is a DRAM which is a volatile memory, for example. However, the technology to be disclosed is also applicable to a non-volatile memory such as a flash memory and a disk device such as an HDD (hard disk drive). According to the embodiment, the memory module is a DIMM including a plurality of DRAMs, for example. According to the embodiment, the memory module is provided in an information processing apparatus such as a personal computer.

A memory error detecting apparatus and memory error detecting method according to this embodiment has a command analysis function and a data comparing function in a logic analyzer which monitors a signal on a memory bus, for example, for easy identification of the physical position of an error address or error bit even when the logical-physical conversion specifications of a memory controller are not available.

With reference to attached drawings, memory error detecting apparatus and memory error detecting method according to embodiments will be described in detail.

Figure 3:
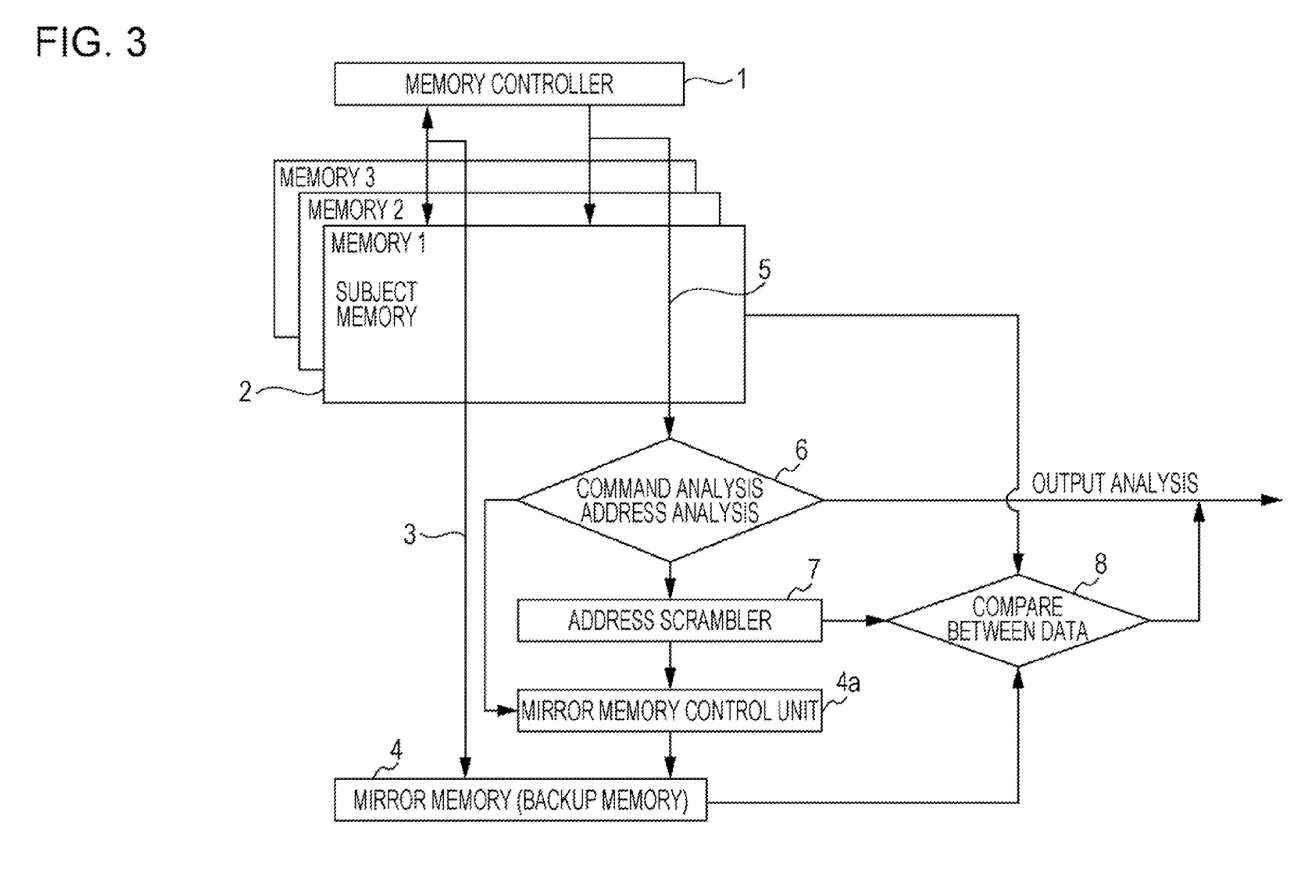
FIG. 3 is a block diagram of a memory error detecting apparatus.

FIG. 3 is a block diagram of a memory error detecting apparatus. The memory error detecting apparatus analyzes signal states of the address/write/read bus on the basis of the protocol of a data bus to manage physical addresses. The memory error detecting apparatus performs mirroring by using a backup memory as a mirror memory and copies data in a memory. The memory error detecting apparatus compares data read from the subject memory being mirrored and the backup memory and thus detects a physical error address.

Memory mirroring refers to a method which writes the same data to two memories for higher redundancy. The data is read from the main memory. When one of the memories has a failure, data may be read and/or write from/to the other memory.

The memory controller 1 controls a memory module 2 functioning as a main storage device in accordance with a command from a CPU. The memory module 2 is a subject memory. The memory controller 1 accesses the subject memory 1, a memory 2, a memory 3, a mirror memory 4 (backup memory) via a data bus 3. The control commands from the memory controller 1 may include initialize, address, read, write, and data. A command analysis unit/address analysis unit 6 accesses the memory 1, memory 2, and memory 3 via an address/write/read bus 5 to perform command/address analysis and acquire a type of the command and the address as a command acquiring portion/an address acquiring portion. On the basis of the analysis result, an address scrambler 7 which controls an address space performs address conversion from a logical address to a physical address as an address convertor. On the basis of the acquired command and physical address, a mirror memory control unit 4a controls the mirror memory 4 so as to cause the same operation as the memory data writing and reading. The mirror memory control unit 4a writes the data transmitted via the data bus 3, that is, the same data as the data written to the memory mirror memory 4. A data comparing unit 8 compares between data read from a memory and the data read from the mirror memory 4. The data processing unit 16 then outputs the analysis result detected on the error address in the memories 1 to 3 on the basis of the comparison between the data in the memories 1 to 3 and the data in the mirror memory 4.

The detection of the error address when the subject memory 2 fails on the basis of the comparison between data in the memories 1 to 3 and the data in the mirror memory 4 allows identification of the physical error address in the subject memory 2.

Figure 4:
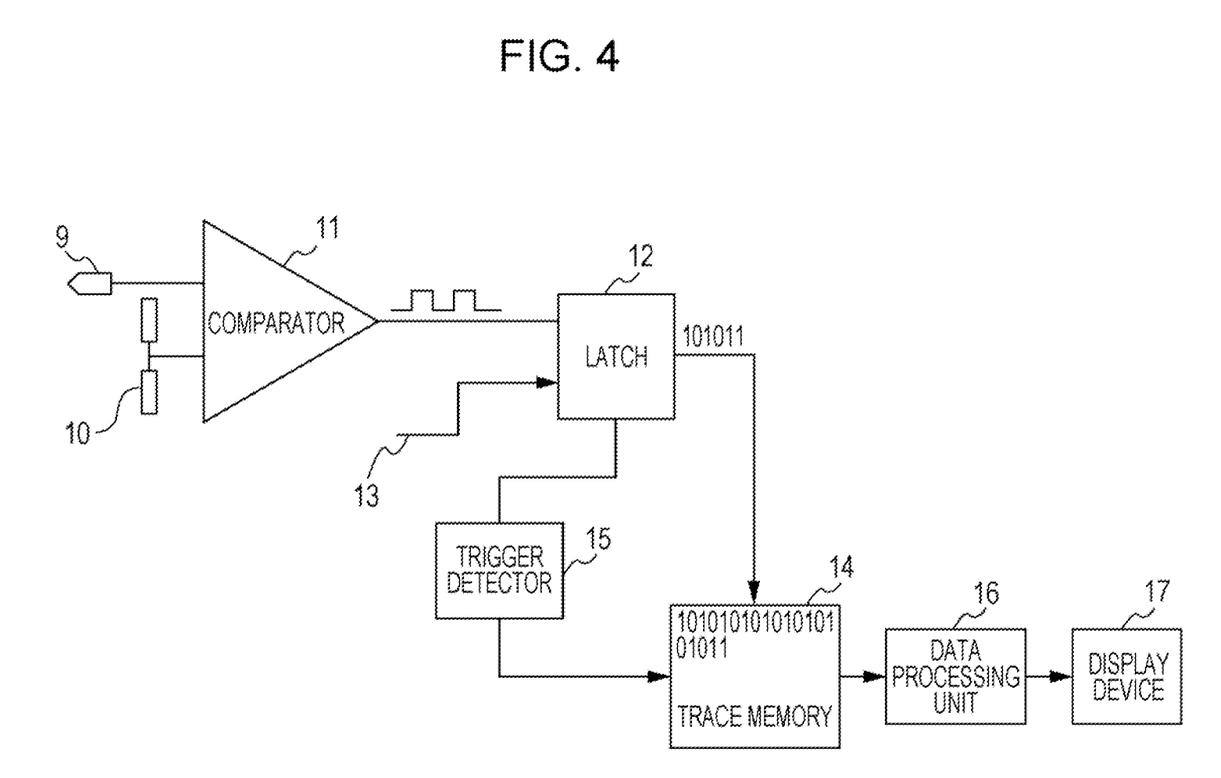
FIG. 4 is a block diagram of the configuration of a logic analyzer.

FIG. 4 illustrates a configuration of the logic analyzer. The logic analyzer has a waveform storing memory for monitoring a nonperiodic signal and has the number of input channels in the order of 16 to 48 channels. The logic analyzer is a tool which quickly samples signals on a transmission line, stores the signal level on a time axis, and analyzes the signal flow (timings and states). The memory for the logic analyzer is controlled as a ring memory for storing sampling data. In other words, when the memory is filled to the capacity, old data is overwritten. A large-capacity memory is provided for many channels, quick sampling and long trace time. The logic analyzer is capable of triggering an event including a complicated sequence and capturing a large amount of digital data from a system under a test environment.

The voltage input from an input probe 9 connected to a subject memory and a threshold voltage 10 are level-compared by a comparator 11, and the output from the comparator 11 is input to a latch 12. A sampling clock 13 is further input to the latch 12. The output from the latch 12 is input to a trace memory 14, and the trace memory 14 starts tracing in response to a trigger signal from a trigger detector 15. A data processing unit 16 performs data processing as an error detector. A display device 17 displays the result. This logic analyzer is applied to the present art.

Figure 5:
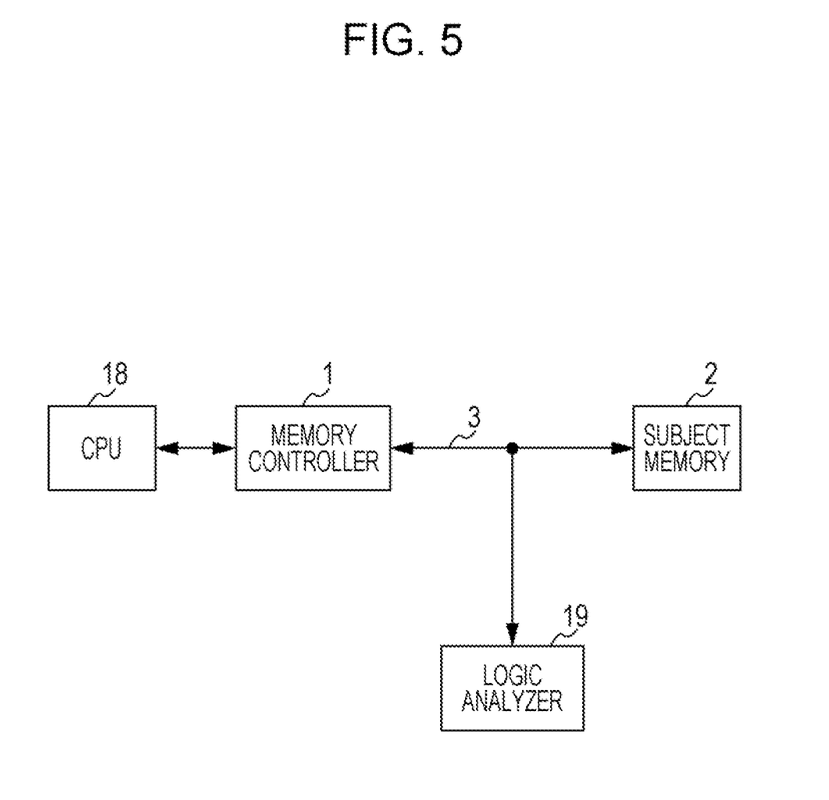
FIG. 5 illustrates a connection example between a memory controller and the logic analyzer.

FIG. 5 illustrates a connection example between the memory controller and the logic analyzer. An instruction is transmitted from the CPU 18 to the memory controller 1, and the memory controller 1 and the subject memory 2 are connected via the data bus 3. The signal to be observed of the subject memory 2 on the data bus 3 is assigned equally to the signal (such as address, data, command) in an internal memory of the logic analyzer 19, and a write/read operation is performed in the same manner as that on the subject memory. The read data in the subject memory and the read data in the memory in the logic analyzer are compared, and an error is detected. The physical information on the error may be directly acquired.

The signal to be observed on the subject memory bus is equally assigned to the signal (such as address, data, and command) in the internal memory of the logic analyzer, and the same write/read operation as that on the subject memory is performed. The read data in the subject memory and the read data in the internal memory of the logic analyzer are compared, and an error is detected. Thus, the physical information on the error may be acquired directly.

Figure 6:
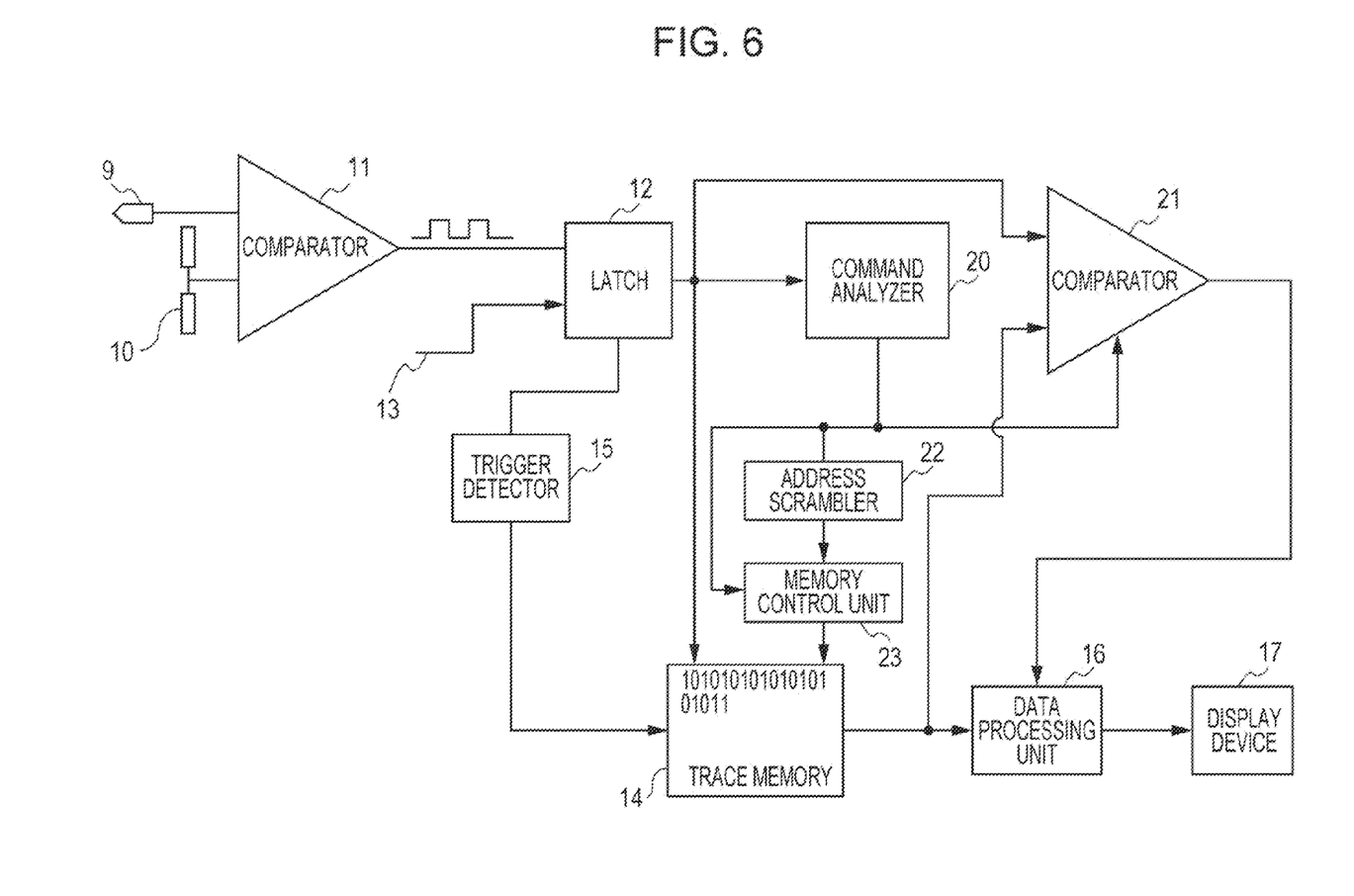
FIG. 6 illustrates a memory error detecting apparatus employing the logic analyzer.

FIG. 6 illustrates a memory error detecting apparatus employing the logic analyzer. The logic analyzer illustrated in FIG. 6 is the logic analyzer in FIG. 4 further including a command analyzer 20 and a comparator 21. The memory control unit 22 acquires a physical address with an address scrambler 23 by converting a logical address acquired by the command analyzer 20 and traces to the trace memory 14 which is a backup memory (mirror memory) on the basis of the physical address. The read data from the subject memory and the data from the traced trace memory 14 are compared to detect the physical error address.

Figure 7:
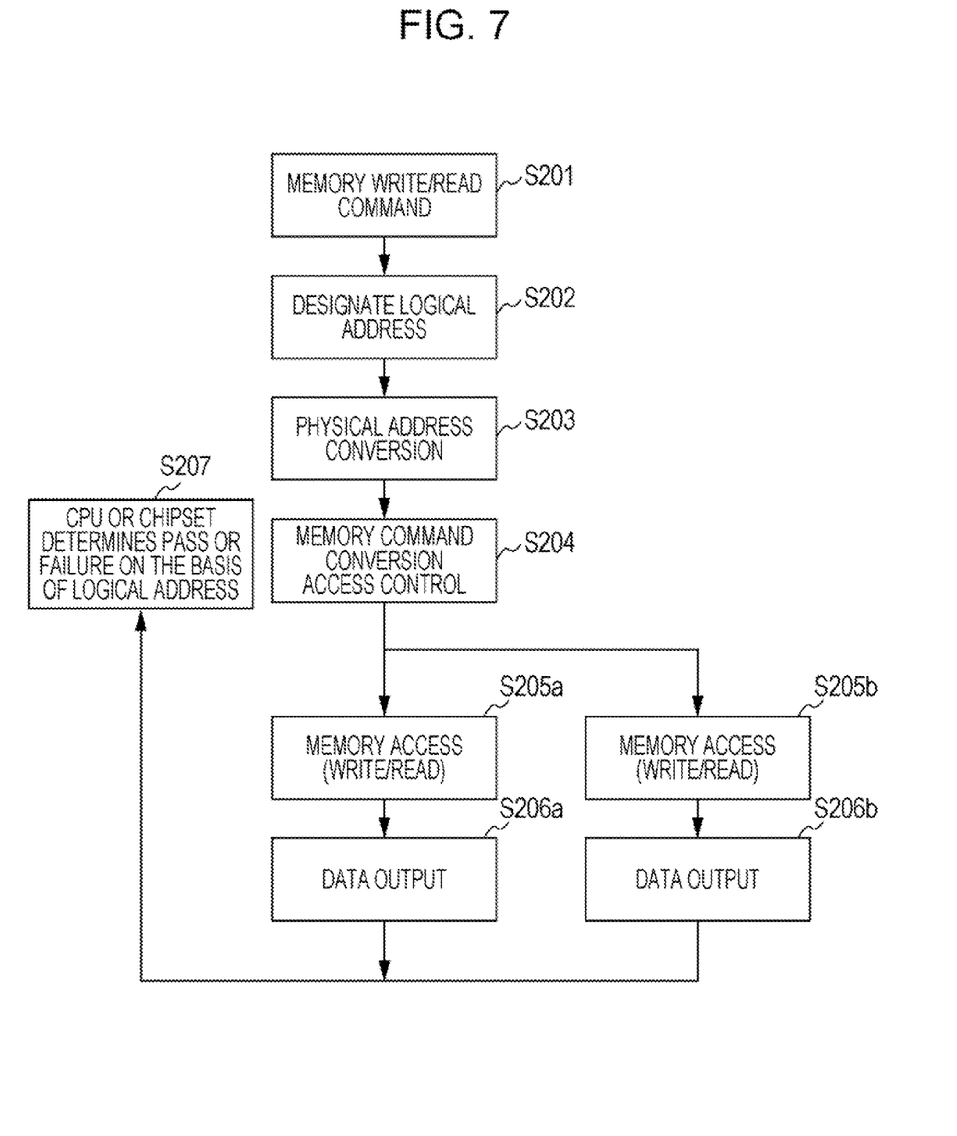
FIG. 7 illustrates a memory access flow.

FIG. 7 illustrates a memory access flow. The CPU instructs the memory controller to write or read to or from a memory (S201). The CPU designates a logical address corresponding to the storage area in the memory to be written or read (S202). The memory controller converts the logical address given by the CPU to a physical address on the basis of the logical-physical conversion specifications (S203) for memory command conversion and performs access control over the memory (S204). The same type of memory as the subject memory may be used as the backup memory, and the data writing or reading may be performed in parallel on the basis of the command. The memories are both accessed and then are written or read (S205a, S205b), the data read from the memories are output to the CPU or the chip set including the memory controller (S206a, S206b). On the basis of this, the CPU or the chip set including the memory controller determines whether the success or failure of the writing or reading on the area designated by the logical address (S207).

Figure 8:
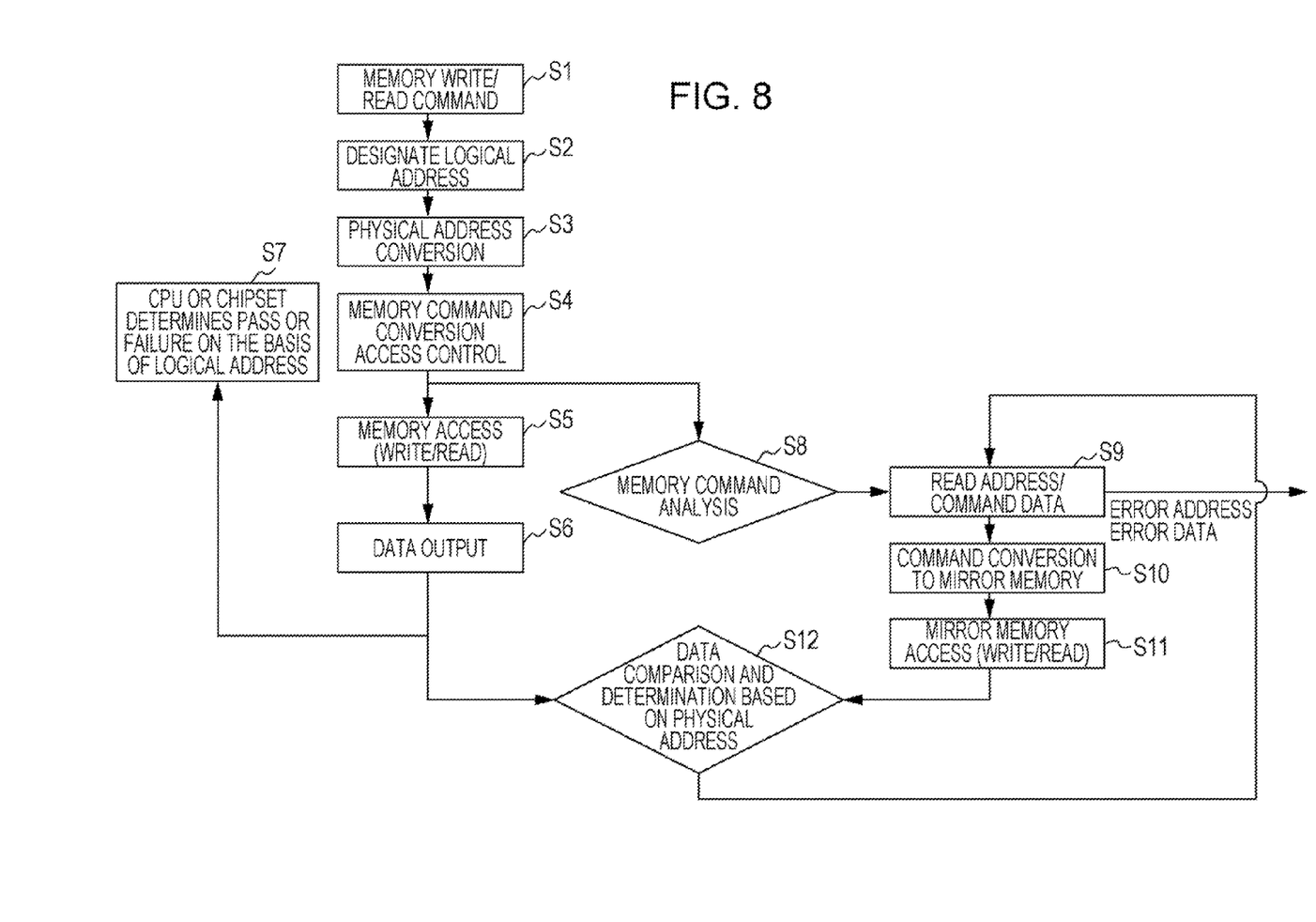
FIG. 8 illustrates a memory access flow.

FIG. 8 illustrates a memory access flow. The CPU instructs the memory controller to write or read to or from a memory (S1). The CPU designates a logical address corresponding to the storage area in the memory to be written or read (S2). The memory controller converts the logical address given by the CPU to a physical address on the basis of the logical-physical conversion specifications (S3) for memory command conversion and performs access control (S4). The memory controller accesses and writes or read data to or from both of the memories (S5) and outputs the data read from the memories to the CPU or a chip set including the memory controller (S6). On the basis of this, the chip set determines whether the success or failure of the writing or reading on the area designated by the logical address (S7) in the same manner as in FIG. 7. In order to perform the memory command conversion for access control over the mirror memory, the command analysis unit/address analysis unit 6 (command analyzer 20) performs memory command analysis (S8). The data comparing unit 8 (comparator 21) reads the address/command/data (S9) and the data processing unit 16 checks the error address and/or error data. The mirror memory control unit 4a (memory control unit 23) further performs command conversion for the mirror memory (trace memory 14) (S10), accesses the mirror memory (trace memory 14) (S11) and performs writing or reading thereon. The data comparing unit 8 (comparator 21) here compares the data read from the memory and the data read from the mirror memory. The data processing unit 16 determines the physical address (S12), and outputs an error signal to the display device. The address/command/data is read on the basis of the error signal, and the error address and/or error data may be checked.

Figure 9:
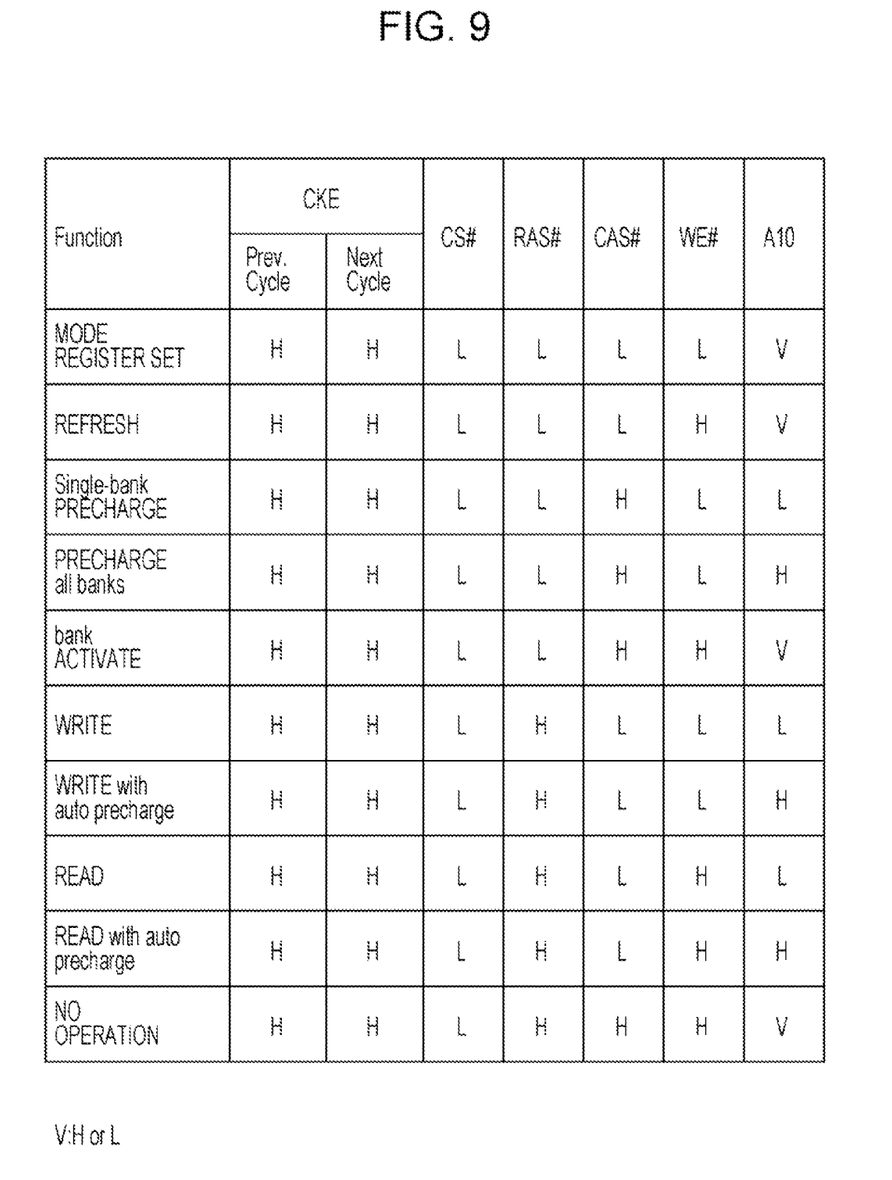
FIG. 9 is a command table (example illustrating a part of DDR3 SDRAMs).

FIG. 9 illustrates a command table (an example illustrating a part of the DDR3 SDRAMs). Illustrated are a part of data buses connected to DRAMS, CKE, CS#, RAS#, CAS#, WE#, and A10.

According to this embodiment, a type of a command is analyzed from signal states (voltage levels of bus lines) of the memory bus on the basis of the memory bus protocol by using the command table and the write data on the memory is mirrored, without limitation to the access algorithm to memory areas, address randomness, and write data. In other words, the memory access is not limited by a fixed access algorithm and a test pattern with data.

According to the memory error detecting method, one memory may be provided separately from the subject memory. Memory writing or reading may be performed thereon simultaneously, and the data are compared to detect an error on the basis of the presence of matched data.

The disclosed logic analyzer analyzes includes a function of analyzing mirrored data and acquiring the error address, a function of scrambling and assigning an address to be mirrored, a function of recognizing a memory bus command and controls data writing to the logic analyzer, a function of performing data writing on the basis of the received address of the memory bus, a function of comparing write data and read data, and a function of detecting a failure bit and/or failure address on the basis of the data comparison result.

As described above, according to the disclosed memory error detecting apparatus and memory error detecting method, the position where a memory error occurs may be identified in a memory being connected to a computer system. The detectability of an error independent of the mode of the error may maintain the reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory error detecting apparatus for detecting an error of a subject memory, the memory error detecting apparatus comprising:
   a memory bus coupled to the subject memory;
   a mirror memory coupled to the memory bus so as to receive the same data as data to be written into the subject memory, the received data being written into the mirror memory;
   an address analyzer configured to analyze an address related to the data written into and read from the subject memory and acquire the address analyzed;
   a mirror memory controller configured to control data writing or reading to or from the mirror memory on the basis of the acquired address;
   a comparator configured to compare data read from the subject memory and data read from the mirror memory;
   an error detector configured to detect a data error on the basis of a result of the comparison;
   an address converter configured to convert a logical address acquired by the address analyzer to a physical address in the subject memory; and
   a command analyzer configured to analyze a command instructed to the subject memory on the basis of a command table of the memory bus and acquire a type of the command,
   wherein the mirror memory controller controls to write the received data into the mirror memory and to read the data from the mirror memory on the basis of the physical address and the acquired command type, and
   the error detector detects a physical address related to the detected data error on the basis of a result acquired by the comparison.

2. The memory error detecting apparatus according to claim 1, further comprising a display device configured to display a result acquired by the comparator.

3. A logic analyzer for monitoring signal of a memory bus coupled to a subject memory, the logic analyzer comprising:
   a mirror memory coupled to the memory bus so as to receive the same data as data to be written into the subject memory, the received data being written into the mirror memory;
   an address analyzer configured to analyze an address related to the data written into and read from the subject memory and acquire the address analyzed;
   a mirror memory controller configured to control data writing or reading to or from the mirror memory on the basis of the acquired address;
   a comparator configured to compare data read from the subject memory and data read from the mirror memory;
   an error detector configured to detect a data error on the basis of a result of the comparison;
   an address converter configured to convert a logical address acquired by the address analyzer to a physical address in the subject memory; and
   a command analyzer portion configured to analyze a command instructed to the subject memory on the basis of a command table of the memory bus and acquire a type of the command,
   wherein the mirror memory controller controls to write the received data into the minor memory and to read the data from the mirror memory on the basis of the physical address and the acquired command type, and
   the error detector detects a physical address related to the detected data error on the basis of a result acquired by the comparison.

4. The logic analyzer according to claim 3, further comprising a display device configured to display a result acquired by the comparator.

5. A memory error detecting method for detecting an error of a subject memory coupled to a memory bus, the memory error detecting method comprising:
   analyzing an address related to the data written into and read from the subject memory and acquire the address analyzed;
   transferring the same data as data to be written to the subject memory into a mirror memory coupled to the memory bus;
   writing the transferred data into the mirror memory on the basis of the acquired address;
   reading data from the subject memory;
   reading data from the mirror memory on the basis of the acquired address;
   comparing the data read from the subject memory and the data read from the mirror memory;
   detecting a data error by the comparison;
   converting a logical address acquired by the analyzing to a physical address in the subject memory;
analyze a command instructed to the subject memory on the basis of a command table of the memory bus and acquire a type of the command; and
   detecting a physical address related to the detected data error on the basis of a result acquired by the comparison,
   wherein the writing includes writing the transferred data into the mirror memory and the reading includes reading the data from the mirror memory on the basis of the physical address and the acquired command type.

6. The memory error detecting method according to claim 5, further comprising displaying a result acquired by the comparison.

* * * * *